(12) United States Patent
Mohebbi et al.

(10) Patent No.: US 9,841,484 B2
(45) Date of Patent: Dec. 12, 2017

(54) RESONATOR DEVICE FOR ELECTRON SPIN RESONANCE

(71) Applicant: Quantum Valley Investment Fund LP, Waterloo (CA)

(72) Inventors: Hamidreza Mohebbi, Kitchener (CA); David G. Cory, Branchton (CA)

(73) Assignee: Quantum Valley Investment Fund LP, Waterloo, Ontario (CA)

( * ) Notice: Subject to any disclaimer, the term of this patent is extended or adjusted under 35 U.S.C. 154(b) by 1080 days.

(21) Appl. No.: 13/931,382

(22) Filed: Jun. 28, 2013

(65) Prior Publication Data

US 2014/0218032 A1    Aug. 7, 2014

Related U.S. Application Data

(60) Provisional application No. 61/759,813, filed on Feb. 1, 2013.

(51) Int. Cl.
*G01R 33/3415*    (2006.01)
*G01R 33/60*    (2006.01)
(Continued)

(52) U.S. Cl.
CPC ......... *G01R 33/60* (2013.01); *G01R 33/3415* (2013.01); *G01R 33/3456* (2013.01); *G01R 33/34023* (2013.01)

(58) Field of Classification Search
CPC  G01R 33/60; G01R 33/3415; G01R 33/3456; G01R 33/34023
See application file for complete search history.

(56) References Cited

U.S. PATENT DOCUMENTS 5,781,011 A      7/1998  Scholes et al.
5,949,311 A  *  9/1999  Weiss ................ H01P 1/215
                                                    333/202
(Continued)

FOREIGN PATENT DOCUMENTS

CN          1445924       10/2003
CN        101460860        6/2009
(Continued)

OTHER PUBLICATIONS

Yong Pang, et al., "Resonant Mode Reduction in Radiofrequency Volume Coils for Ultrahigh Field Magnetic Resonance Imaging" National Institutes of Health Public Access Author Manuscript, Jul. 28, 2011, 13 pages.
(Continued)

*Primary Examiner* — Dixomara Vargas
(74) *Attorney, Agent, or Firm* — Henry Patent Law Firm PLLC

(57) ABSTRACT

In some aspects, a resonator device for spin resonance applications is described. In some examples, the resonator device includes a substrate, terminals, and resonators. The terminals include a first terminal having first terminal segments disposed on a substrate surface, and a second terminal having second terminal segments disposed on the substrate surface opposite the first terminal segments. The resonators include conductors disposed on the substrate surface between the first and second terminals. Each conductor is disposed between one of the first terminal segments and a respective, opposite one of the second terminal segments.

26 Claims, 9 Drawing Sheets

(51) Int. Cl.
*G01R 33/345* (2006.01)
*G01R 33/34* (2006.01)

(56) References Cited

U.S. PATENT DOCUMENTS

| | | | |
|---|---|---|---|
| 6,771,070 B2 * | 8/2004 | Lee | G01R 33/3456 324/318 |
| 6,828,789 B2 | 12/2004 | Hyde et al. | |
| 7,088,104 B2 * | 8/2006 | Bottomley | G01R 33/3415 324/322 |
| 7,391,212 B2 | 6/2008 | Maier et al. | |
| 8,045,319 B2 * | 10/2011 | Ritter | H01G 2/06 361/303 |
| 8,531,250 B1 * | 9/2013 | Luschas | H03B 5/1228 257/531 |
| 8,570,033 B2 | 10/2013 | Prisner et al. | |
| 8,587,314 B2 * | 11/2013 | Burns | G01R 33/34007 324/318 |
| 2008/0231281 A1 | 9/2008 | Fain et al. | |
| 2009/0219019 A1 | 9/2009 | Taherian et al. | |
| 2011/0050225 A1 | 3/2011 | Prisner et al. | |
| 2012/0068706 A1 | 3/2012 | Prisner et al. | |
| 2013/0093424 A1 | 4/2013 | Blank et al. | |

FOREIGN PATENT DOCUMENTS

| | | |
|---|---|---|
| EP | 2269045 | 1/2011 |
| NO | 2014/117256 | 8/2014 |

OTHER PUBLICATIONS

Tsutomu Nakada, et al., "$^{31}$P NMR Spectroscopy of the Stomach by Zig-Zag Coil" Magnetic Resonance in Medicine 5, Apr. 28, 1987, pp. 449-455.

Extended European Search Report issued in EPO Application No. 14745648.7 on Oct. 6, 2016, 3 pages.

Benningshof et al., "Superconducting microstrip resonator for pulsed ESR of thin films," Journal of Magnetic Resonance, vol. 230, pp. 84-87, Feb. 2013.

Petryakov et al., "Segmented surface coil resonator for in vivo EPR applications at 1.1 GHz," Journal of Magnetic Resonance, vol. 198, pp. 8-14, May 2009.

Sage et al., "Study of loss in superconducting coplanar waveguide resonators," Journal of Applied Physics, vol. 109, No. 6, p. 63915, Mar. 2011.

Johansson et al., "A stripline resonator for Esr," Review of Scientific Instruments, vol. 45, No. 11, pp. 1445-1447, Nov. 1974.

Islarkowicz et al., "Planar microresonators for EPR experiments," Journal of Magnetic Resonance, vol. 175, No. 2, pp. 275-284, Aug. 2005.

International Search Report and Written Opinion of the International Searching Authority issued in International Application No. PCT/CA2016/000196 on Oct. 20, 2016, 9 pages.

Chen L.F. et al. "Microwave Electronics: Measurement and Materials Characterization", John Wiley & Sons, Technology & Engineering, Nov. 19, 2004, Chapter 9, pp. 382-413, ISBN 0-47084491-2.

Fan et al., "Microstrip Resonator as a Measuring Device for a Single Molecule Magnet", Process in Electromagnetics Research Symposium Proceedings, Cambridge, USA, Jul. 5-8, 2010, pp. 1146-1150.

Henderson et al., "High Frequency Microstrip Cross Resonators for Circular Polarization Electron Paramagnetic Resonance Spectroscopy", Review of Scientific Instruments, vol. 79, No. 074704, Jul. 21, 2008, pp. 074704-1 to 074704-4, doi: 10.1063/1.2957621.

Malissa et al., "Superconducting Coplanar Waveguide Resonators for Low Temperature Pulsed Electron Spin Resonance Spectroscopy", Review of Scientific Instruments, vol. 84, No. 025116, Feb. 26, 2013, pp. 025116-1 to 0251116-5 doi: 10.1063/1.4792205.

Sienkiewicz et al., "Dielectric Resonator-Based Resonant Structure for Sensitive ESR Measurements at a High-Hydrostatic Pressures", Journal of Magnetic Resonance, vol. 177, 2005, pp. 278-290, doi: 10.1016/j.jmr.2005.08.002.

Torrezan et al., "Microstrip Resonators for Electron Paramagnetic Resonance Experiments", Review of Scientific Instruments, vol. 80, No. 075111, Jul. 31, 2009, pp. 075111-1 to 075111-6, doi: 10.1063/1.3186054.

International Search Report and Written Opinion of the International Searching Authority issued in International Application No. PCT/CA2014/000068 on Mar. 17, 2014, 12 pages.

State Intellectual Property Office of P.R. China, Notification of First Office Action in Chinese App. No. 201480007199.9 dated Jun. 13, 2017, with English language translation, 37 pages.

Amsuss, R., et al., "Cavity QED with Magnetically Coupled Collective Spin States", Physical Review Letters 107, 060502, Aug. 3, 2011, 5 pages.

Ballester, Manuel, et al., "Inert Carbon Free Radicals. I. Perchlorodiphenylmethyl and Perchlorotriphenylmethyl Radical Series", Journal of the American Chemical Society 93:9, pp. 2215-2225, May 5, 1971, 11 pages.

Borneman, Troy W, et al., "Bandwith-Limited Control and Ringdown Suppression in High-Q Resonators", http://arXiv:1207.1139v2 [quant-ph], Jan. 21, 2013, 20 pages.

Borneman, T.W., et al., "Parallel Information Transfer in a Multinode Quantum Information Processor", Physical Review Letters 108, 140502, Apr. 2, 2012, 5 pages.

Bose, Sangita, et al., "Upper critical field in nanostructured Nb: Competing effects of the reduction in density of states and the mean free path", Physical Review B 74, 224502, Dec. 8, 2006, 5 pages.

Bushev, P., et al., "Ultralow-power spectroscopy of a rare-earth spin ensemble using a superconducting resonator", Physical Review B 84, 060501 (R), Aug. 5, 2011, 4 pages.

Dinardo, A. J., et al., "Superconducting Microstrip High-Q Microwave Resonators", Journal of Applied Physics 42, 1, pp. 186-189, Jan. 1971, 5 pages.

Duty, Tim, "Towards superconductor-spin ensemble hybrid quantum systems", Physics 3, 80, Sep. 27, 2010, 3 pages.

Feher, G., et al., "Electron Spin Resonance Experiments on Donors in Silicon. II. Electron Spin Relaxation Effects", Physical Review 114, 5, Jun. 1, 1959, 18 pages.

Feher, G., et al., "Polarization of Phosphorus Nuclei in Silicon", Physical Review Letters 103, pp. 501-503, 1956, 3 pages.

Fink, J. M., et al., "Dressed Collective Qubit States and the Tavis-Cummings Model in Circuit QED", Physical Review Letters 103, 083601, Aug. 17, 2009, 4 pages.

Hoult, D. I., et al., "The Quantum Origins of the Free Induction Decay Signal and Spin Noise", Journal of Magnetic Resonance 148, pp. 182-199, 2001, 18 pages.

Huang, et al., "Strip Line Power Splitter", University of Electronic Science and Technology Press, Microwave Transmission and its Circuits, 1st ed, pp. 264-65, Aug. 2010, cited by SIPO in the Notification of 1st Office Action in Chinese App. No. 201480007199.9 dated Jun. 13, 2017.

Imamoglu, Atac, "Cavity QED Based on Collective Magnetic Dipole Coupling: Spin Ensembles as Hybrid Two-Level Systems", Physical Review Letters 102, 083602, Feb. 27, 2009, 4 pages.

Jiang, Liang, et al., "Distributed quantum computation based on small quantum registers", Physical Review A 76, 062323, Dec. 26, 2007, 22 pages.

Kubo, Y., et al., "Strong Coupling of a Spin Ensemble to a Superconducting Resonator", Physical Review Letters 105, 140502, Sep. 27, 2010, 4 pages.

Malissa, H., et al., "Superconducting coplanar waveguide resonators for low temperature pulsed electron spin resonance spectroscopy", http://arXiv:1202.6305v1 [cond-mat.mess-hall], Feb. 28, 2012, 4 pages.

Mehring, Michael, et al., "Spin-bus concept of spin quantum computing", Physical Review A 73, 052303, May 4, 2006, 12 pages.

Narkowicz, R., et al., "Planar microresonators for EPR experiments", Journal of Magnetic Resonance 175, pp. 275-284, 2005, 10 pages.

(56) References Cited

OTHER PUBLICATIONS

Narkowicz, R., et al., "Scaling of sensitivity and efficiency in planar microresonators for electron spin resonance", Review of Scientific Instruments 79, 084702, 2008, 9 pages.

Rinard, George A, et al., "Relative Benefits of Overcoupled Resonators vs Inherently Low-Q Resonators for Pulsed Magnetic Resonance", Journal of Magnetic Resonance, Series A 108, pp. 71-81, 1994, 11 pages.

Saito, K, "Critical Field Limitation of the Niobium Superconducting Rf Cavity", The 10th Workshop on RF Superconductivity, Tsukuba, Japan, pp. 583-587, 2001, 5 pages.

Schuster, D. I., et al., "High-Cooperativity Coupling of Electron-Spin Ensembles to Superconducting Cavities", Physical Review Letters 105, 140501, Sep. 27, 2010, 4 pages.

Schweiger, Arthur, "Principles of Pulse Elctron Paramagnetic Resononace", Manipulation of electron and nuclear spins, pp. 138-139, Oxford University Press, 2001, 2 pages.

Skibbe, U., et al., "A 2D-NMR Method to Study Near-Surface Regions of Conductors", Colloids and Surfaces, 45, pp. 235-242, 1990, 8 pages.

Sodickson, Aaron, et al., "A generalized k-space formalism for treating the spatial aspects of a variety of NMR experiments", Progress in Nuclear Magnetic Resonance Spectroscopy 33, pp. 77-108, 1998, 32 pages.

Tavis, Michael, et al., "Exact Solution for an N-Molecule-Radiation-Field Hamiltonian", Physical Review 170, 2, pp. 379-384, Jun. 10, 1968, 6 pages.

Tinkham, Michael, "Introduction to Superconductivity", Second Edition, pp. 20-21, McGraw-Hill, Inc., 3 pages.

Veciana, Jaume, et al., "Free Radicals as Clathrate Hosts: Crystal and Molecular Structure of 1 : 1 Perchlorotriphenylmethyl Radical-Benzene", J. Chem. Soc., Chem. Commun., pp. 812-814, 1987, 3 pages.

Xu, et al., "Transmission Line Resonator", Basics of the Microwave Technology, Science Press, 1st ed., pp. 164-67, Sep. 2009, cited by SIPO in the Notification of 1st Office Action in Chinese App. No. 201480007199.9 dated Jun. 13, 2017.

Zmuidzinas, Jonas, "Superconducting Microresonators: Physics and Applications", Annu. Rev. Condens. Matter Phys. 2012.3:169-214, May 11, 2017, 48 pages.

\* cited by examiner

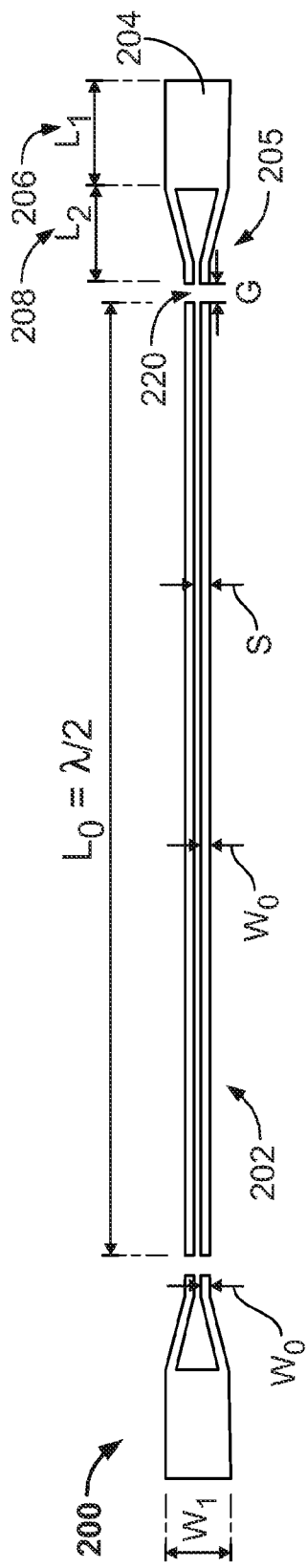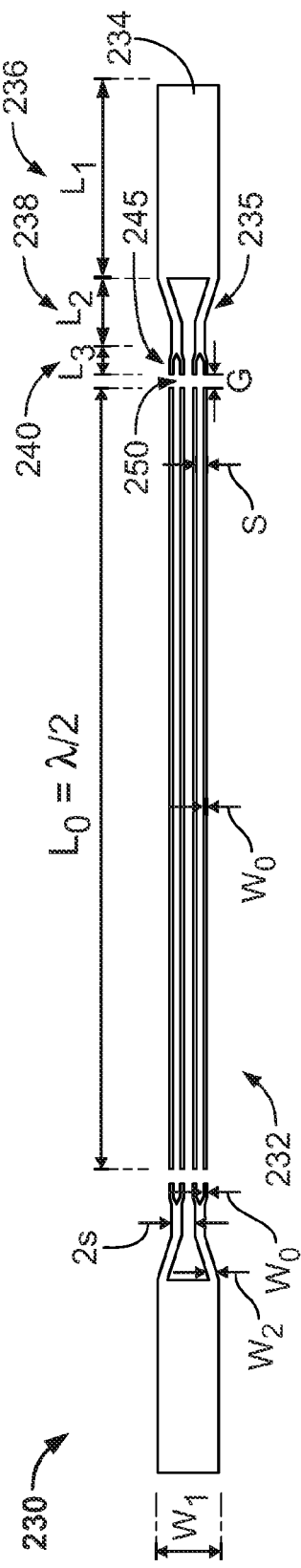
FIG. 2A
FIG. 2B

RESONATOR DEVICE FOR ELECTRON SPIN RESONANCE

CROSS-REFERENCE TO RELATED APPLICATIONS

This application claims priority to U.S. Provisional Application Ser. No. 61/759,813, filed on Feb. 1, 2013, entitled "Resonator Device."

BACKGROUND

This specification relates to a resonator device for magnetic resonance applications, including electron spin resonance (ESR) applications. Magnetic resonance systems are used to study various types of samples and phenomena. In some magnetic resonance applications, the spins in a sample are polarized by a static, external magnetic field, and a resonator manipulates the spins by producing a magnetic field at a frequency near the spins' resonance frequencies. In electron spin resonance (ESR) applications, resonators typically operate at microwave frequencies to interact with electron spins in the sample.

SUMMARY

In one general aspect of what is described here, a resonator device includes multiple parallel resonators that can be driven in-phase.

In some aspects, an electron spin resonance (ESR) resonator device includes a substrate having a planar substrate surface. The ESR resonator device includes a first terminal that includes first terminal segments disposed on the substrate surface; a second terminal that includes second terminal segments disposed on the substrate surface opposite the first terminal segments; and resonators between the first and second terminals. The resonators include conductors disposed on the substrate surface. Each resonator's conductor is disposed between one of the first terminal segments and a respective, opposite one of the second terminal segments.

Implementations may include one or more of the following features. The resonators are microstrip resonators each configured to resonate at the same microwave resonance frequency. Each of the resonators is a half-wave resonator, a full-wave resonator, or a multi-half-wave resonator. Each of the resonators is configured to provide maximum magnetic field at the center of each half-wave segment.

Additionally or alternatively, these and other implementations may include one or more of the following features. The ESR resonator device includes a substrate having a first side that includes the substrate surface and a second side opposite the first side. The ESR resonator device includes a ground conducting plane disposed on the second side of the substrate.

Additionally or alternatively, these and other implementations may include one or more of the following features. The resonator conductors are parallel to each other, with equal spacing between each neighboring pair of conductors. Each of the conductors is elongate and includes a first end capacitively coupled to one of the first terminal segments; and a second, opposite end capacitively coupled to one of the second terminal segments. The ESR resonator device can include a first dielectric volume between the first end of each conductor and one of the first terminal segments; and a second dielectric volume between the second end of each conductor and one of the second terminal segments. The dielectric volume can include dielectric material, vacuum, or both. The dielectric volume may also be referred to as a "dielectric gap" or "gap." The first and second dielectric volumes can be different materials Additionally or alternatively, these and other implementations may include one or more of the following features. The first terminal includes a first terminal conductor disposed on the substrate surface. The first terminal conductor has a first terminal input side and a first terminal segmented side. The first terminal segmented side includes the first terminal segments. The second terminal includes a second terminal conductor disposed on the substrate surface. The second terminal conductor has a second terminal input side and a second terminal segmented side. The second terminal segmented side includes the second terminal segments. The first terminal includes a first branching structure between the first terminal input side and the first terminal segmented side; and the second terminal includes a second branching structure between the second terminal input side and the second terminal segmented side.

Additionally or alternatively, these and other implementations may include one or more of the following features. The first and second branching structures each include successive levels between the input side and the respective segmented side, and the individual branches in each level typically have twice the impedance of the individual branches in the preceding level. The branching structures can each include one or more tapered branch sections starting at the third level from the terminal side.

Additionally or alternatively, these and other implementations may include one or more of the following features. The first and second terminal conductors and resonator conductors form a surface coil (or a planar resonator) on the substrate. The first and second terminal conductors and the resonator conductors are made of conducting material or superconducting material. The ESR resonator device includes a sample region adjacent to the surface coil and on the opposite side from the substrate.

In some aspects, an electron spin resonance (ESR) method is described. An excitation and control signal is received at a terminal input of an ESR resonator device. The terminal input is conductively coupled to terminal output segments. The excitation and control signal is provided from the terminal output segments to a plurality of resonators. The excitation and control signal is delivered in phase from each of the terminal segment to a respective resonator.

Implementations may include one or more of the following features. The excitation and control signal is received at first and second terminal inputs of the ESR resonator device. The excitation and control signal is generated external to the ESR resonator device, for example, by electronics connected to the terminal inputs. The first terminal input is conductively coupled to a first set of terminal output segments and the second terminal input is conductively coupled to a second set of terminal output segments. The excitation and control signal is provided to the resonators from the first and second sets of terminal output segments. The excitation and control signal is provided to the resonators by capacitive coupling between the first set of terminal output segments and first ends of the resonators; and the second set of terminal output segments and second, opposite ends of the resonators. The resonators generate a magnetic field that is uniform across a planar sample region. Precessing electron spins in the sample region can induce an electromotive force (emf) across the resonator at a microwave frequency.

In some aspects, an electron spin resonance (ESR) method is described. An excitation and control signal is received at a planar surface coil disposed on a substrate, and the planar surface coil includes a plurality of parallel resonators. A magnetic field is generated in a sample region adjacent to the surface coil and opposite the substrate. The magnetic field is generated by the plurality of parallel resonators conducting the excitation and control signal in the same direction and in parallel.

Implementations may include one or more of the following features. The parallel resonators are elongate and the method includes receiving the excitation and control signal at terminal segments at a first end of each resonator and at terminal segments at a second, opposite end of each resonator. The parallel resonators are capacitively coupled to the terminal segments.

Additionally or alternatively, these and other implementations may include one or more of the following features. An electron spin in the sample region is manipulated by the magnetic field. The sample region can be a planar volume at the center of the half wave resonators. The magnetic field is substantially uniform in a planar volume above the substrate.

Some of the example devices and techniques described here can be used for electron spin resonance (ESR) applications, nuclear magnetic resonance (NMR) applications, and other applications. In some implementations, the resonator device can include multiple resonators that effectively act as coupled cavities with a high quality factor, and can generate a substantially uniform microwave frequency magnetic field having a small mode volume. In some instances, the example resonator devices and techniques described here can be used in additional or different applications, including other scenarios where high quality factor, low mode volume, or a combination of these or other properties are desirable.

The details of one or more implementations are set forth in the accompanying drawings and the description below. Other features, objects, and advantages will be apparent from the description and drawings, and from the claims.

DESCRIPTION OF DRAWINGS

FIGS. 2A, 2B, and 2C are top views of surface coils of example resonator devices.

Like reference symbols in the various drawings indicate like elements.

DETAILED DESCRIPTION

Figure 1:
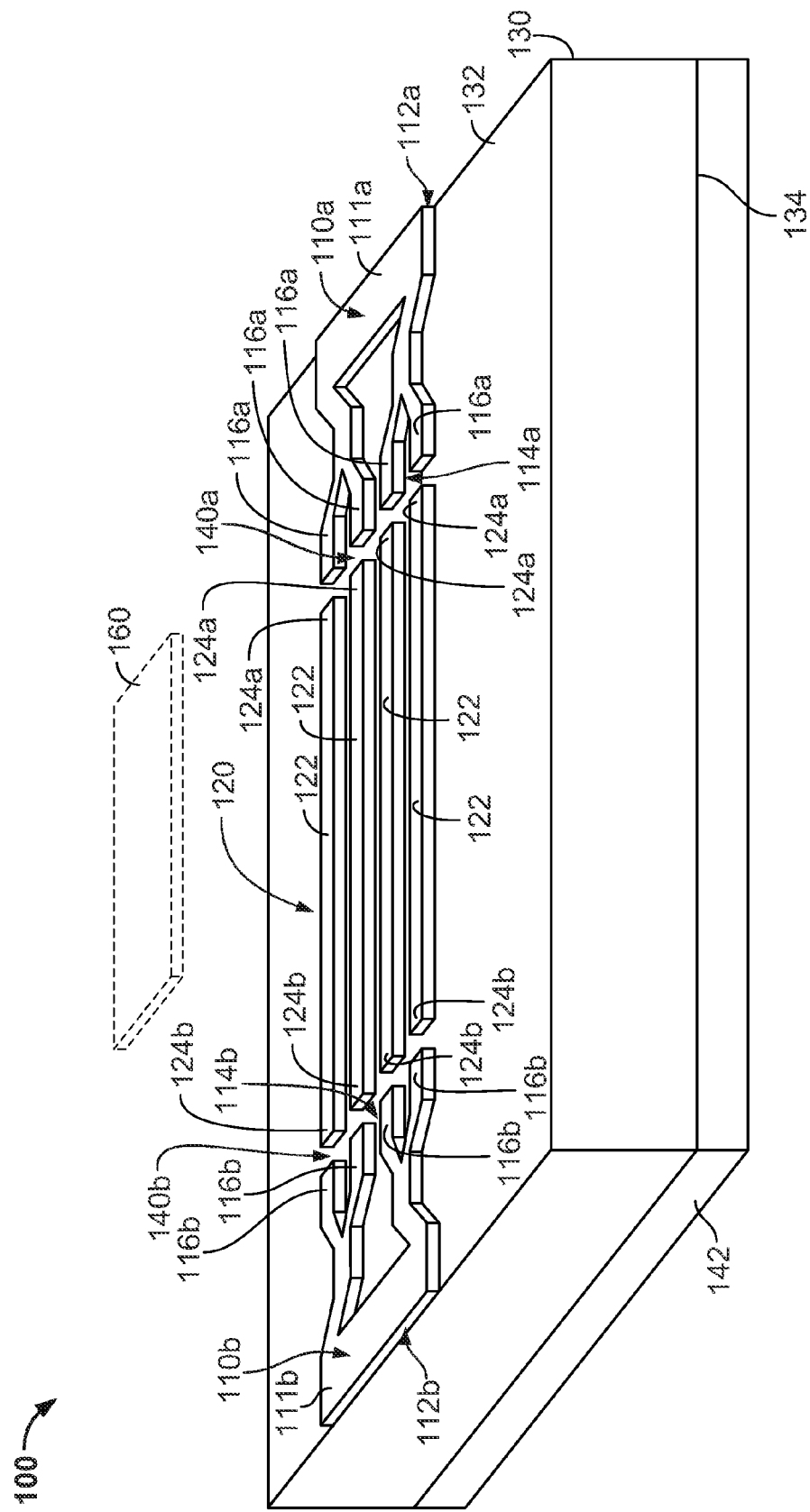
FIG. 1 is a schematic perspective view of an example resonator device.

In some aspects of what is described here, a resonator device having a high quality factor can produce a magnetic field that has a low mode volume. In some implementations, the resonator device can be used for ESR (electron spin resonance) applications (e.g., pulsed ESR, continuous wave ESR) to produce a microwave frequency ($\mu A$) magnetic field that is substantially homogeneous within planes across the ESR sample. In some instances, the resonator device can be built based on a microstrip configuration that includes an array of superconducting microstrip transmission lines ($\mu TL$). In some instances, the microstrip lines are driven in-phase at a specified frequency, and they produce a magnetic field profile with small mode volume uniformly distributed on planes parallel to the substrate of the microstrip lines.

In some example implementations, the resonator device can include two terminals and an array of resonators between the two terminals. The terminals and the resonators can be structured as microstrip transmission lines, with a ground plane and surface conductors disposed on opposite sides of a dielectric substrate. The surface conductors can define a surface coil on one side of the substrate, with the ground plane disposed on the opposite side of the substrate. In operation, the terminals can receive a signal (e.g., a microwave frequency resonance signal) from the electronics and deliver the signal to the array of resonators. The input signal can be a drive signal that originates from electronics that are external to the resonator device. The resonators can carry the input signal in parallel between the two terminals and produce a magnetic field in a sample region outside the resonators (e.g., in a region above the substrate). In some instances, the resonators can act as coupled cavities, and the resonator device can have a high quality factor and produce a microwave magnetic field in a sample region above the resonator.

In some implementations, the terminals have a branching structure that divides the input signal among the array of resonators. For example, each terminal can include a terminal input on one side of the terminal and multiple segments on another side of the terminal. The branching structure can match impedances at each branch point to deliver equal power to each segment, and each segment can deliver its power to one of the resonators. The two terminals can be symmetrical to one another, for example, such that each segment in one terminal is a mirror image of a corresponding segment in the other terminal, with one of the resonators aligned between each corresponding pair of segments.

In some examples, a resonator device can have only a single terminal. For instance, a single terminal can be used at one end of the resonators and the other end of the resonators can be left open, or terminated by a circuit load such as a 50 ohm resistive load. In such cases, the single terminal can be used for both transmission and detection. The example resonator devices shown as having two terminals in FIGS. 1, 2A, 2B, and 2C can be modified to have only a single terminal. For example, one of the two terminals can be omitted from the resonator device, or the resonator device may be otherwise modified to be operated by a single terminal.

In some implementations, the segments are end-coupled to the resonators by dielectric gaps on both ends of each resonator. The terminals and the resonators can be capacitively coupled across each respective dielectric gap. The input signal can be delivered in-phase to each resonator by the end-coupling between the resonators and the terminal segments. The resonators can be edge-coupled to each other along their lateral sides. The array of resonators can operate as half-wave resonators, single-wave resonators, or multi-half-wave resonators, and each resonator can carry the input signal in-phase with the other resonators. The array of resonators carrying the input signal can generate a uniform magnetic field in a local region above and near the resonators.

FIG. 1 is a schematic perspective view of an example resonator device 100. FIG. 1 shows various features of the example resonator device 100 schematically; example dimensions and geometry are shown and described with respect to FIGS. 2A, 2B, and 2C. The example resonator device 100 can be operated to produce a time-varying magnetic field in a sample region 160 above the resonator device 100. For example, the resonator device 100 may produce a radio frequency (rf) or microwave frequency (μf) field configured to manipulate nuclear or electron spins in the sample region 160.

The example resonator device 100 shown in FIG. 1 includes two terminals 110a, 110b and an array of resonators 120 between the terminals 110a, 110b. The terminals 110a, 110b and the array of resonators 120 with the ground plane 142 can define microstrip transmission line structures that include any metal material (e.g., conducting material, superconducting material, etc.) on an upper surface 132 of a dielectric substrate 130 separated from a ground plane 142 on a lower surface 134 of the dielectric substrate 130. The dielectric substrate 130 can be made of dielectric material such as, for example, sapphire, silicon, quartz, or another type of non-magnetic dielectric crystalline material. A resonator device can include additional or different features, and the features of a resonator device may be arranged in the configuration shown or in another configuration.

As shown schematically in FIG. 1, each terminal 110a, 110b includes a respective conductor 111a, 111b disposed on an upper surface 132 of the substrate 130. Each conductor 111a, 111b has a body with a respective input side 112a, 112b and a respective segmented side 114a, 114b. The segmented sides 114a, 114b each include a respective set of segments 116a, 116b extending from the body toward the array of resonators 120. The segmented sides 114a, 114b are illustrated as each including four segments 116a, 116b. In various implementations, each terminal can include two segments (e.g., as in FIG. 2A, or in another configuration), four segments (e.g., as in FIG. 2B, or in another configuration), eight segments (e.g., as in FIG. 2C, or in another configuration), sixteen segments, thirty-two segments, sixty-four segments, or in general powers of two. The terminals 110a, 110b are aligned with each other on opposite sides of the array of resonators 120, such that each of the segments 116a on one terminal 110a aligns with a corresponding one of the segments 116b on the other terminal 110b.

As shown schematically in FIG. 1, each resonator in the array of resonators 120 includes a respective conductor 122 disposed on the upper surface 132 of the substrate 130. Each of the conductors 122 is aligned between one of the segments 116a and a respective, opposite one of the segments 116b. Each of the conductors 122 is elongate and includes two ends 124a and 124b. The first end 124a of each conductor 122 is capacitively coupled to a respective one of the terminal segments 116a, while the second, opposite end 124b of each conductor 122 is capacitively coupled to a respective one of the terminal segments 116b. The array of resonators 120 can include two resonators (e.g., as in FIG. 2A, or in another configuration), four resonators (e.g., as in FIG. 2B, or in another configuration), eight resonators (e.g., as in FIG. 2C, or in another configuration), sixteen resonators, thirty-two resonators, sixty-four resonators, or in general powers of two.

In the example shown in FIG. 1, a dielectric gap 140a is defined between the first end 124a of each conductor 122 and the segments 116a. Similarly, a dielectric gap 140b is defined between the second end 124b of each conductor 122 and the segments 116b. The dielectric gaps 140a, 140b can include vacuum, dielectric material (e.g., sapphire, silicon, quartz, etc.), or a combination of them. The terminal segments 116a, 116b can serve as feed lines coupled to the array of resonators 120 via the dielectric gaps 140a, 140b. In some implementations, each of the resonators 120 is capacitively end-coupled to a corresponding segment at each end. In some instances during operation, all of the resonators 120 experience an electromagnetically equivalent feed line path from the same pair of terminals 110a, 110b, and the resonators 120 can resonate in-phase at their fundamental frequency.

Figure 2C:
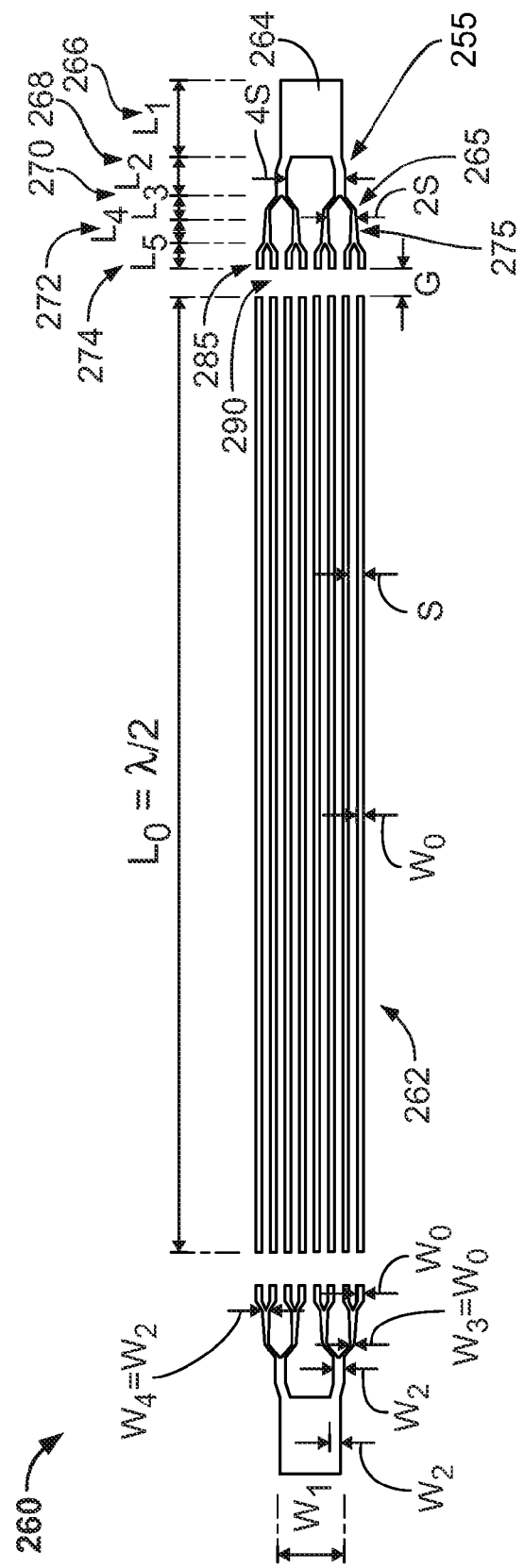

In some implementations, the body of each terminal 110a, 110b includes a branching structure between the input side 112a, 112b and the respective segmented side 114a, 114b. The branching structure can function as a power divider that divides and delivers the power from the terminal input side 112a, 112b to the terminal segments 116a, 116b. In some instances, the branching structure can include successive levels (or division stages) between the terminal input side 112a, 112b and the respective segmented side 114a, 114b. In some instances, the branching structure can be configured to achieve desirable branch impedances at each division stage. For example, the branching structure can be designed to match all input impedances of the branches in certain division stages to improve (e.g., increase, maximize, optimize, or otherwise improve) power transfer and reduce signal reflections. In some implementations, the individual branches in each level may have twice the impedance of the individual branches in the preceding level. In some implementations, the power dividers can include tapered branch sections, for example, to adjust the lines for impedance matching. The terminals 110a and 110b illustrate an example branching structure with four terminal segments 116a and 116b, respectively. Some example branching structures are shown in FIGS. 2A, 2B, and 2C. The terminals 110a, 110b can have another type of structure.

In some implementations, each of the resonators 120 has a microstrip configuration, in which the conductors 122 on the upper surface 132 each interact with a common ground plane 142 on the lower surface 134. In some implementations, the example resonators 120 can be identical to each other. In some examples, the conductors 122 are parallel to each other, with equal spacing between each neighboring pair of the conductors 122. Here, "parallel" is used broadly to describe structures that are exactly or substantially parallel, when considered on the structures' largest length scales. Two structures can be considered parallel, for example, when their neighboring sides, centerlines, or other dominant structural features are parallel or include only insubstantial deviations from parallel.

The example resonators 120 can be sized based on the wavelength of a desired resonance frequency. For example, the length of the resonators 120 (e.g., from one end 124a to the other end 124b) can be designed to produce a first resonance around the desired frequency of operation (e.g., $\omega_r$=10 GHz). Each of the resonators 120 can be a half-wave resonator, a full-wave resonator, or a multi-half-wave resonator. For example, if the desired resonance frequency is $\lambda$, the resonators 120 can have a length of $\lambda/2$, $\lambda$, $3\lambda/2$, $2\lambda$, etc.

The resonators 120 can be configured to resonate at the same microwave resonance frequency. In some instances, the resonators 120 can be configured to generate a magnetic field with a maximum field intensity at the center of the half-wave segments of the resonators, for example, by using a half-wave resonator for each of the resonators 120. In some implementations, the resonators 120 can be edge-coupled to each other so that the magnetic field generated by each resonator interferes with the magnetic field generated by one or more neighboring resonators. In some cases, the resonators 120 produce an in-plane uniform field in a direction perpendicular to the surface 132.

The conductors 111a and 111b of the terminals 110a and 110b and the conductors 122 of the resonators 120 can form a planar surface coil on the upper surface 132 of the substrate 130. The example planar surface coil on the upper surface 132 extends to some height above the upper surface 132 and has a small aspect ratio. Here, "planar" is used broadly to describe structures that are substantially larger in one or both planar dimensions (length and width) than in their height dimension. In some instances, a planar structure has a height that is substantially uniform (e.g., compared to the overall length and width of the structure) over its planar extent. In some implementations, the planar surface coil can receive an input signal (e.g., through a terminal input side 112a), conduct the signal across each of the parallel resonators 120 in the same direction, and generate a magnetic field in the sample region 160.

In some implementations, the terminals 110a and 110b, as well as the resonators 120 are configured as superconducting transmission lines. The conducting material of the terminals 110a and 110b, and conducting material of the resonators 120 can be made of superconducting material, such as, for example, niobium, niobium titanium, niobium nitride, aluminum, yttrium barium copper oxide (aka, "YBCO"), or another appropriate material. The conducting material of the terminals 110a and 110b and the conductors 122 of the resonators 120 can be made of other types of conducting material, such as, for example, non-superconducting materials including copper, gold, etc. The conducting materials can be deposited on the substrate 130 by standard deposition techniques. The substrate 130 can be etched or otherwise conditioned based on standard fabrication techniques.

The example sample region 160 shown in FIG. 1 is located adjacent to the surface coil opposite to the substrate 130. The sample region 160 can be a planar volume or another type of volume. In some instances, the magnetic field generated by the resonators 120 is uniform across the sample region 160. For example, the sample region 160 can include planes (parallel to the surface 132) over which the instantaneous magnetic field generated by the resonators 120 is homogeneous during operation. The sample region 160 include samples for ESR applications or experiments, or for additional or different applications. In some implementations, the samples can be thin planar samples, for example, Langmuir-Blodgett films, polymer films, biological films, etc. Some example applications of the resonator device 100 can include using the Langmuir-Blodgett films with free radicals for quantum computing, and using the biological films to, for example, label electrons and study membrane bound proteins using ESR.

In some implementations (e.g. for pulsed ESR applications, etc.), the example resonator device 100 and the sample can be placed in an external, static magnetic field ($B_0$). The external magnetic field can be parallel to the upper and lower surfaces 132, 134, so that the external field lines do not penetrate the superconducting material of the surface coil. The external magnetic field can polarize the electron spins in the sample. The electron spins have a resonance frequency (or spin precession frequency) in the external magnetic field. The resonance frequency is typically in the GHz range (microwave frequencies) in ESR applications. In operation, the resonators 120 can generate a microwave field at the resonance frequency of the electron spins to manipulate the electron spins.

The example resonator device 100 may also be used to generate a detection signal. The detection signal can be produced by a voltage induced across the resonators 120 by precession of electron spins in the sample region 160. For example, the spins can inductively couple to the resonators as the spins precess in the external magnetic field. The resonators 120 can transfer the detection signal to the terminals 110a, 110b. The terminals 110a, 110b can transfer the detection signal to an external system, where it can be detected, recorded, etc.

FIGS. 2A, 2B, and 2C are top views of surface coils for three example resonator devices 200, 230, and 260. The terminals of the example resonator devices 200, 230, and 260 include branching structures with multiple sections, for example, to divide power in multiple stages to the terminal segments. As shown in FIGS. 2A, 2B, and 2C, the terminal segments in the example resonator devices 200, 230, and 260 are coupled to two, four, and eight resonators, respectively. The three example devices 200, 230, and 260 can include some or all of the features of the example resonator device 100 of FIG. 1. For example, the three example surface coils can be made of superconducting material deposited on a substrate, with a ground conducting plane on an opposite side of the substrate. Additional or different sections or components can be included in a resonator device, and a resonator device may be configured in another manner.

The illustrated example resonator devices 200, 230, and 260 include components with example sizes (e.g., length, width, spacing, etc.) and parameters (e.g., impedance, etc.). The sizes and the parameters can be designed, implemented, modified, or otherwise configured according to desired characteristics and functionalities of the devices, applications, system requirements, or other criteria. In the examples shown, the example resonator devices 200, 230, and 260 include arrays of half-wave resonators, each having a width $W_0$ and length $L_0=\lambda/2$, where $\lambda$ is the wavelength of the microwave signal. The spacing between each adjacent pair of resonators is S. Resonators of other lengths, widths, spacings, or types can be used.

The example resonator devices 200, 230, and 260 illustrated in FIGS. 2A, 2B, and 2C are mirror symmetric. In the discussion that follows, the right half of each example resonator device 200, 230, and 260 is described; the left half has the same configuration in a mirrored orientation. A resonator device may be constructed with other types of symmetry, or a resonator device can have an asymmetric configuration.

FIG. 2A is a top view showing the surface coil of the first example resonator device 200, which includes two resonators 202. The terminal 204 of the first example resonator device 200 includes two sections, a first section 206 of length $L_1$ and width $W_1$, and a second section 208 of length $L_2$. The length ($L_1$) of the first section 206 can be designed to suppress all fringing fields and evanescent modes created at the discontinuity of the external microwave launcher and connector, while the width ($W_1$) of the first section 206 can be designed to achieve a desired impedance value for the first section 206. For instance, the width ($W_1$) can be designed to have a 50Ω transmission line in the first section 206, which depends on the height and the dielectric constant of the substrate (e.g., the substrate 130 of the FIG. 1). At the second section 208, the 50Ω transmission line can be divided into two smaller 100Ω segments 205 each with width $W_0$, which is the same as the width of the resonators 202. The branching structure can function as a power divider, where each of the segments 205 can serve as a matched feed line for one of the resonators 202 for providing the maximum power transfer.

In the example shown in FIG. 2A, a gap 220 of width G extends between the ends of the resonators 202 and the two segments 205. The gap 220 can include dielectric material, vacuum, or a combination of them. In some instances, the gap 220 can provide capacitive coupling between the segments 205 and the resonators 202. The size of the gap 220 (G) can affect the quality factor Q of the device 200. For example, if the size of the gap 220 is small compared to the spacing S between two adjacent resonators 202, the gap 220 can be modeled by a series capacitor between one of the segments 205 and a corresponding one of the resonators 202. On the other hand, if the size G of the gap 220 increases, the shunt capacitors between the segments 205 and the ground plane (e.g., the ground plane 142 in FIG. 1), and also inter-capacitance between the tips of each segment 205 and each resonator 202 can influence the coupling section. Some example effects of the size of a gap between the feed lines and the resonators on the quality factor Q are illustrated with respect to FIG. 6.

FIG. 2B is a top view showing the surface coil of the second example resonator device 230 that includes four resonators 232. The terminal 234 of the second example resonator device 230 includes three sections, a first section 236 of length $L_1$, a second section 238 of length $L_2$, and a third section 240 of length $L_3$. As an example, similar to the first section 206 of the first example resonator device 200, the first section 236 can be a 50Ω microstrip line with width $W_1$. The first section 236 divides into two smaller branches 235 with width $W_2$. The width ($W_2$) of the branches 235 can be chosen to achieve a desired impedance value for the two branches 235 in the second section 238. For instance, each of the two branches 235 can be a 100Ω microstrip line. The length ($L_2$) of the second section 238 can be designed, for example, to keep the load impedance unchanged such that two shunted 100Ω microstrip lines form an impedance matching with the impedance of the input 50Ω microstrip line in the first section 236.

In the third section 240, each of 100Ω branches 235 divides into two higher impedance transmission lines to define four segments 245. In some implementations, the spacing between the two branches 235 in the second section 238 can be 2S such that the four segments are feed lines aligned to the four λ/2-resonators 232, where the spacing between each pair of neighboring resonators is S. The spacing between the resonators can be chosen to adjust the strength and uniformity of the microwave magnetic field in the sensitive plane. The four segments can be capacitively coupled to the four λ/2-resonators 232 by a dielectric gap 250. Similar to the gap 220 of the first example device 200, the gap 250 can include dielectric material, vacuum, or a combination of them. The size G of the gap 250 can be designed to achieve desired properties (e.g., high qualify factor and critical coupling condition) as discussed previously.

FIG. 2C is a top view showing the surface coil of the third example resonator device 260, which includes eight resonators 262. The terminal 264 of the third example resonator device 260 includes five successive sections: a first section 266 of length $L_1$, a second section 268 of length $L_2$, a third section 270 of length $L_3$, a fourth section 272 of length $L_4$, and a fifth section 274 of length $L_5$. The conductor in each of the first four levels divides into two conductors in the successive level. Accordingly, after the first section 266, each level includes one or more pairs of conductors extending from a single conductor in the preceding level. The first section 266, and the second sections 268 are similar to the first section 236 and the second section 238 of the second example device 230. For instance, the first section 266 can include a 50Ω microstrip line with width $W_1$, and the second section 268 can include two branches 255, each with width $W_2$ to achieve a 100Ω microstrip line. The first section 266 and second section 268 can be configured in another manner.

The example third section 270 includes four branches 265 of high-impedance microstrip lines with width $W_3$. The third section 270 (with length $L_3$) can be created after the second stage of power division (at the section 268). Each of the branches 265 can be a high impedance line (e.g., $Z_0$=140Ω–170Ω) so the width $W_3$ can be small. In some implementations, the length ($L_3$) can be designed to be small such that its input impedance becomes equal to the load impedance seen from the end part of the third section 270.

The example fourth section 272 is a tapered branch section that includes four tapered branches 275. The tapered branches 275 can have a width $W_3$ at one end adjoining the third section 270 and a different (larger) width $W_4$ at the other end adjoining the fifth section 274. The tapered branch section can be designed, for example, to convert the high-impedance microstrip lines of the third section 270 with width $W_3$ into four 100Ω microstrip lines with width $W_4$=$W_2$ as input lines to the fifth section 274. The length ($L_4$) of the fourth section 272 can be chosen such that its cutoff frequency does not interfere with the desired resonant frequency of the example resonator device 260.

The example fifth section 274 includes eight segments 285 of high-impedance microstrip lines. The eight segments 285 are coupled to the wider end of the tapered branches 275, and of the eight segments 285 has a width $W_0$ that is matched to the width of the resonators 262. In some implementations, the eight segments 285 have the same width and length as the branches in the third section 270 (i.e., $W_0$=$W_3$, $L_5$=$L_3$). Therefore the eight segments 285 can exhibit the same characteristic impedance as the high-impedance microstrip lines in the third section 270 (e.g., $Z_0$=140Ω–170Ω)). The eight segments 285 can serve as feed lines and be capacitively coupled to the eight λ/2-resonators 262 via a dielectric gap 290. The gap 290 can include dielectric material, vacuum, or a combination of them. The size G of the gap 250 can be designed to achieve desired device properties (e.g., high qualify factor and critical coupling condition).

In some instances, the spacing between each pair of neighboring branches in each section can be designed such that the segment of the last section is aligned with a respective resonator. For example, in the third example resonator device 260, the spacing between the two branches 255 in the second section 268 is 4S, the spacing between the two neighboring branches 265 in the third section 270 is 2S, and the spacing between the two neighboring segments 285 in the fifth section 274 is S, where S is the spacing between two adjacent resonators 262. In some instances, the spacing between adjacent resonators can be chosen such that the uniform magnetic field generated above the resonators occurs at desired height. For example, the spacing may affect the edge coupling between resonators. An appropriate spacing may be determined based at least in part on the effective magnetic field resulting from the combination and interference among the magnetic field generated by each individual resonator.

In some instances, a resonator device can include more than eight resonators, and the terminals can be modified to feed each resonator. For example, the power division stages (e.g., the fourth section 272 and the fifth section 274) can be repeated following each other as needed. For example, to feed sixteen resonators, one example approach is to add two more stages including eight tapered branches after the fifth section 274 of the third example resonator device 260 and then sixteen segments of high-impedance microstrip lines after the eight tapered branches. This pattern can be continued to feed an array of resonators through a gap capacitor. Consequently, the number of resonators can increase in powers of two, resulting in an array of $N=2^n$ resonators. Additional or different methods or techniques can be applied.

In some instances, to increase the number of resonators, more division levels are needed to address microstrip segments which would have progressively higher characteristic impedance. Microstriplines with high characteristic impedance $Z_0$ may require low aspect ratios which can be more difficult to fabricate and could limit the Q-factor in some instances. One example approach is to limit the characteristic impedance of the transmission lines in the third division stage and after to a range, for example, $Z_0=140\Omega-170\Omega$. Additionally, a small tapered section can be used to build power dividers, such as illustrated in FIG. 2C for the eight resonators.

Figure 3:
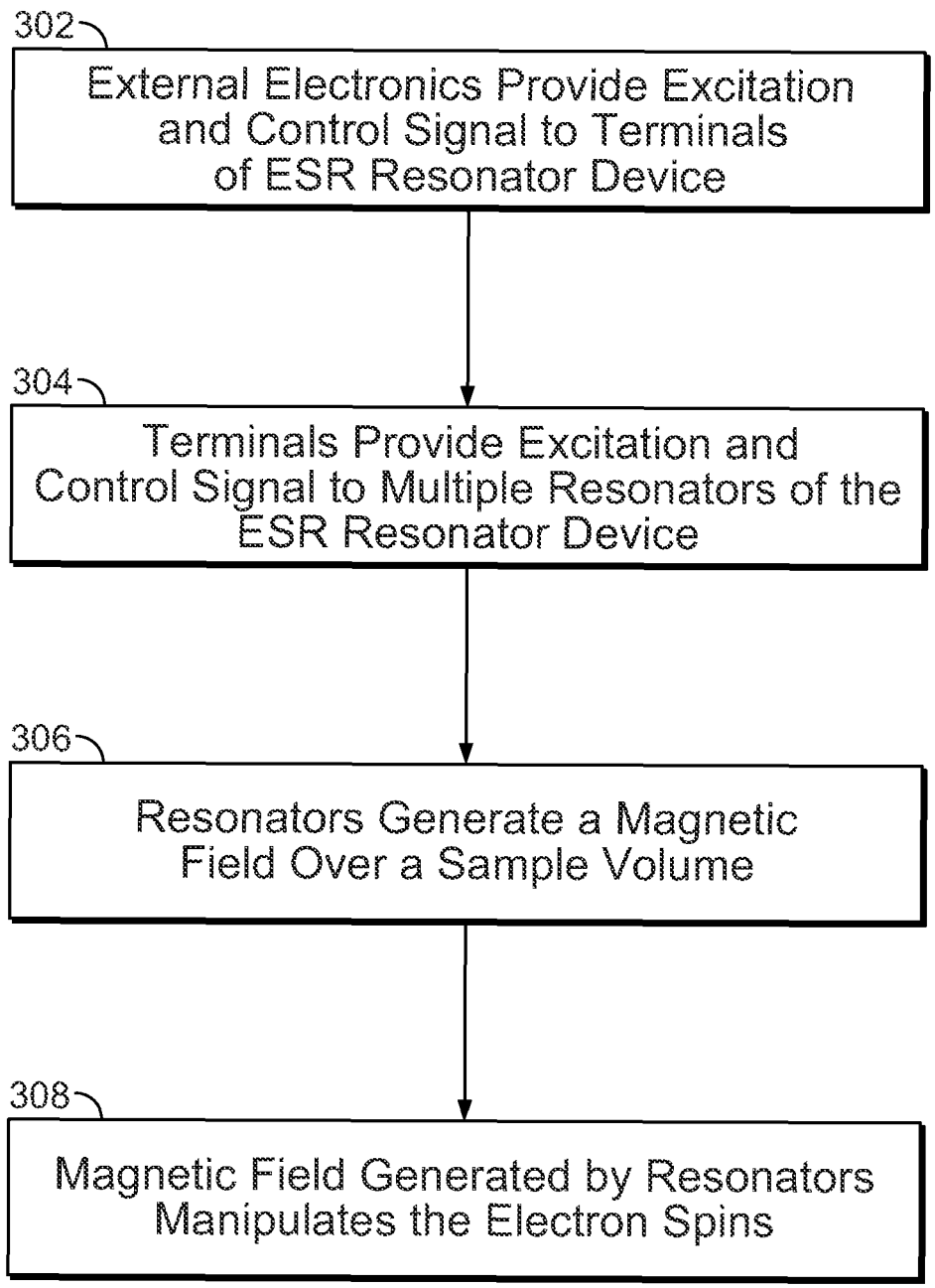
FIG. 3 is a flow chart showing an example electron spin resonance technique.

FIG. 3 is a flow chart illustrating an example electron spin resonance process 300. All or part of the example process 300 may be implemented using a resonator device such as, for example, the example resonator device 100 shown in FIG. 1, or the example resonator devices 200, 230, or 260 shown in FIGS. 2A, 2B, and 2C, or another type of resonator device. The process 300, individual operations of the process 300, or groups of operations may be iterated or performed simultaneously to achieve a desired result. In some cases, the process 300 may include the same, additional, fewer, or different operations performed in the same or a different order.

Initially, a sample containing an ensemble of electron spins can be placed in a static, external magnetic field, and the external magnetic field can (at least partially) polarize the ensemble and define a resonance frequency of the electron spins. The sample can be positioned in the sample volume of an ESR resonator device.

At 302, an excitation and control signal is provided to the ESR resonator device. In some instances, the excitation and control signal is generated externally (i.e., external to the ESR resonator device) and provided to the ESR resonator device through one or more leads on the device. For example, the excitation and control signal can be generated by external electronics that are connected to the terminals of the ESR resonator device.

In some cases, each terminal of the ESR resonator device includes a terminal input and multiple terminal output segments, and the terminal output segments are coupled (e.g., capacitively coupled) to multiple resonators. The terminal can serve as a power splitter that divides and delivers the excitation and control signal from the terminal input to the terminal output segments, and the terminal output segments can feed the excitation and control signal to the resonators. As an example, the excitation and control signal can be received at the terminals 110a and 110b of the example resonator device 100 shown in FIG. 1. The terminals 110a, 110b can deliver the excitation and control signal to the respective terminal segments 116a, 116b.

In some implementations, the excitation and control signal can be a microwave signal. For example, the frequency of the excitation and control signal can be in the 1 GHz to 50 GHz frequency range. In some instances, the frequency of the excitation and control signal is the desired resonance frequency of the ESR resonator device. For example, if the ESR resonator device has a 10 GHz resonance frequency, the ESR resonator device can be powered at 10 GHz.

In some implementations, the excitation and control signal is provided to a planar surface coil disposed on a substrate, where the planar surface coil includes multiple parallel conductors. For example, the planer surface coil can include the surface coil formed by the conductors of the terminals 110a and 110b, and the parallel conductors 122 of the resonators 120 of the example resonator device 100 in FIG. 1.

At 304, the excitation and control signal is provided to the resonators of the ESR resonator device. In some instances, the excitation and control signal is provided from the terminal output segments to the resonators. For example, the excitation and control signal can be provided by capacitive coupling between the terminal output segments and respective ends of the resonators via dialectic gaps. In some instances, the excitation and control signal can be delivered in-phase from each terminal output segment to a respective resonator. For example, all of the resonators can simultaneously receive the same signal with a common phase at each location on the resonators. As such, the phase of the signal on each resonator can be substantially identical at each instant in time.

At 306, the resonators generate a time-varying (e.g., microwave frequency) magnetic field over the sample volume of the ESR resonator device. For example, the resonators can convert the excitation and control signal to a magnetic field in the sample volume. In some instances, the resonators can generate a microwave field, for example, when powered by a microwave signal. The magnetic field can be generated adjacent to the surface coil and opposite the substrate. In some implementations, the magnetic field can be in-plane homogeneous in a sample region (e.g., a planar sample region), such that the magnetic field is uniform in planes crossing the sample region. This field can be substantially uniform in strength and occupy a small mode volume well matched to the volume of the sample. The generated magnetic field can be applied to one or more samples in the sample region, for example, for pulsed ESR.

At 308, the magnetic field generated by the resonators manipulates the electron spins in the sample volume. The frequency of the magnetic field produced by the resonators can be tuned to the resonance frequency of the electron spins in the sample. In some implementations, the duration and power of the magnetic field (produced by the resonators at 306) can be specified to rotate the electron spins by a particular angle. In some instances, there may be electron spins that have different resonance frequencies in a given sample, and the frequency of the microwave field can be tuned to selectively manipulate a particular set of electron spins.

In some cases, the ESR resonator device generates a detection signal based on the dynamics of the electron spins in the sample volume. For example, as the electron spins precess, they can induce an electromotive force (emf) across the resonators, and the induced emf can be detected as the ESR resonance signal.

Figure 4A:
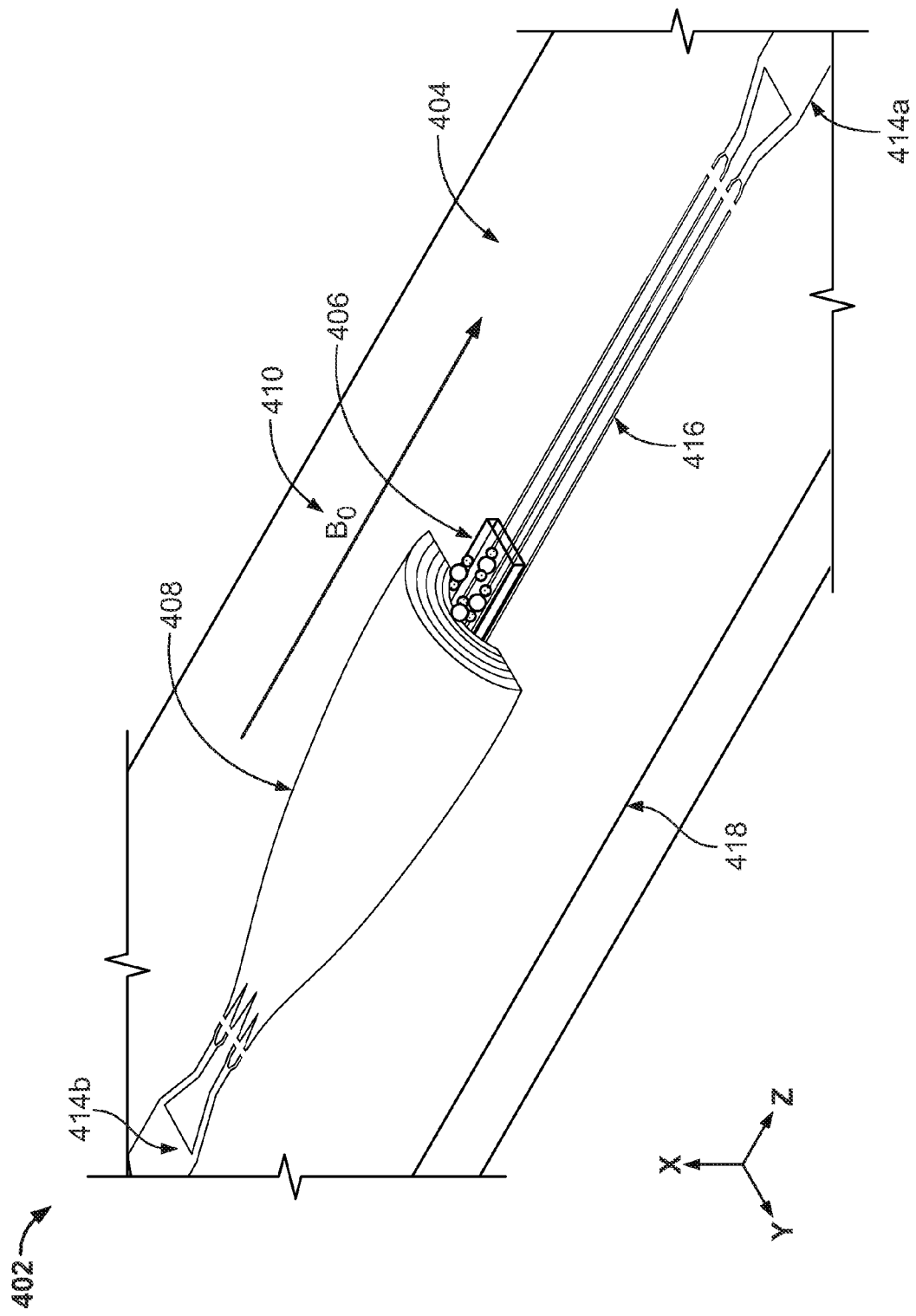
FIGS. 4A and 4B are schematic diagrams of the magnetic field generated by the example resonator device simulations.
Figure 4B:
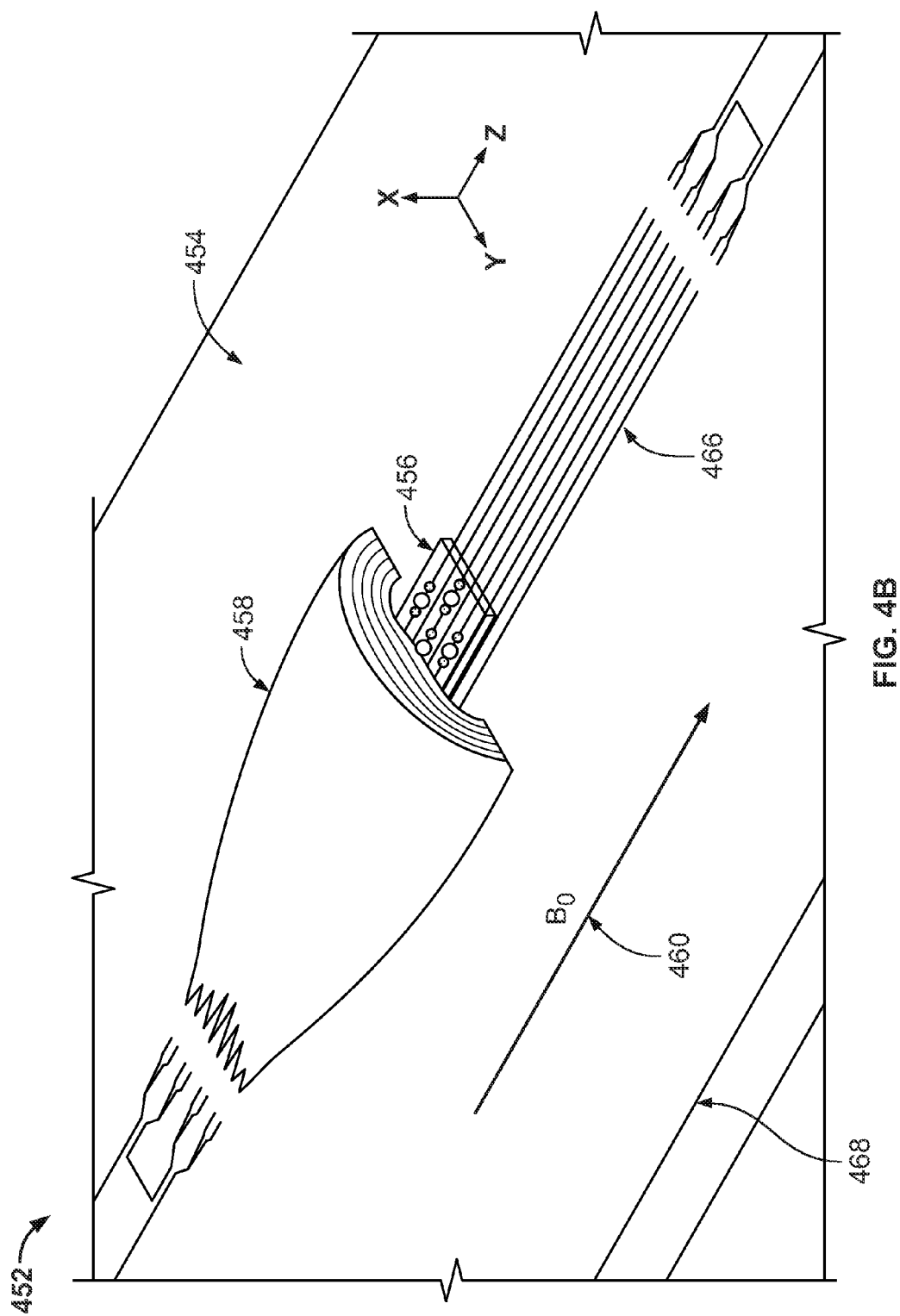

FIGS. 4A and 4B are schematic diagrams of example resonator device simulations. FIG. 4A is a schematic diagram 402 of example simulation of an example resonator device 404 that includes four resonators, and FIG. 4B is a schematic diagram 452 of example simulation of an example resonator device 454 that includes eight resonators. The numerical simulations were performed by Ansoft High Frequency Structure Simulator (Ansoft HFSS).

As shown in FIG. 4A, the example resonator device 404 is subject to an external magnetic field $B_0$ (410) along the z-axis. The external magnetic field 410 is parallel to the conductor plane of the four resonators 416, which avoids penetration of the magnetic field 410 into the resonators 416. An excitation and control signal can be applied to the terminals 414a and 414b of the resonator device 404 and delivered to the resonators 416. The resonators 416 can generate a magnetic field 408. A sample region 406 is located above a substrate surface 418 of the resonator device 404. The magnetic field 408 can be uniformly distributed along the y-axis in planes parallel to the substrate surface 418. The magnetic field 408 can have a small mode volume. In some instances, the level of uniformity of the magnetic field 408 depends on a height along the x-axis relative to the substrate surface 418. In some instances, at a higher position (e.g., 100 µm), the magnetic field 408 can become highly uniform and the sample region 406 for a spin system can be placed at the position to experience the uniform magnetic field 408.

Similarly, in FIG. 4B, the resonator device 454 is placed in an external magnetic field $B_0$ (460) along the z-axis, parallel to the conductor plane of the eight resonators 466. The eight resonators 466 can be edge-coupled and generate a magnetic field 458 having uniform distributions along the y-axis. A planar sample region 456 is located above and parallel to a substrate surface 468 such that the magnetic field 458 is uniform across the sample region 456. Samples placed in the sample region 456 can experience a homogeneous magnetic field, for example, for ESR.

In some implementations, the property (e.g., direction, intensity, time duration, mode volume resonance frequency, etc.) of the magnetic fields (e.g., 408 or 458) can be adjusted, for example, by controlling the excitation and control signal (e.g., in terms of frequency, amplitude, duration, etc.) applied to the resonator devices (e.g., 404 or 454, respectively). In some other implementations, the resonator devices 404 and 454 can be modified to provide a desired magnetic field property. For instance, the spacing between adjacent resonators (e.g., 416 or 466) can be adjusted to provide a uniform magnetic field occurring at desired height. The sizes (e.g., length, width, spacing, shape, etc.) and other property (conductor and substrate materials, thickness of the substrate, thickness of the conductor, dielectric constant, attenuation constant, etc.) of the terminals and the array of the resonators can be adjusted to provide a desired quality factor and mode volume. Additional or different factors can be incorporated and implemented in providing a desired magnetic field generated by the resonator device.

Figure 5A:
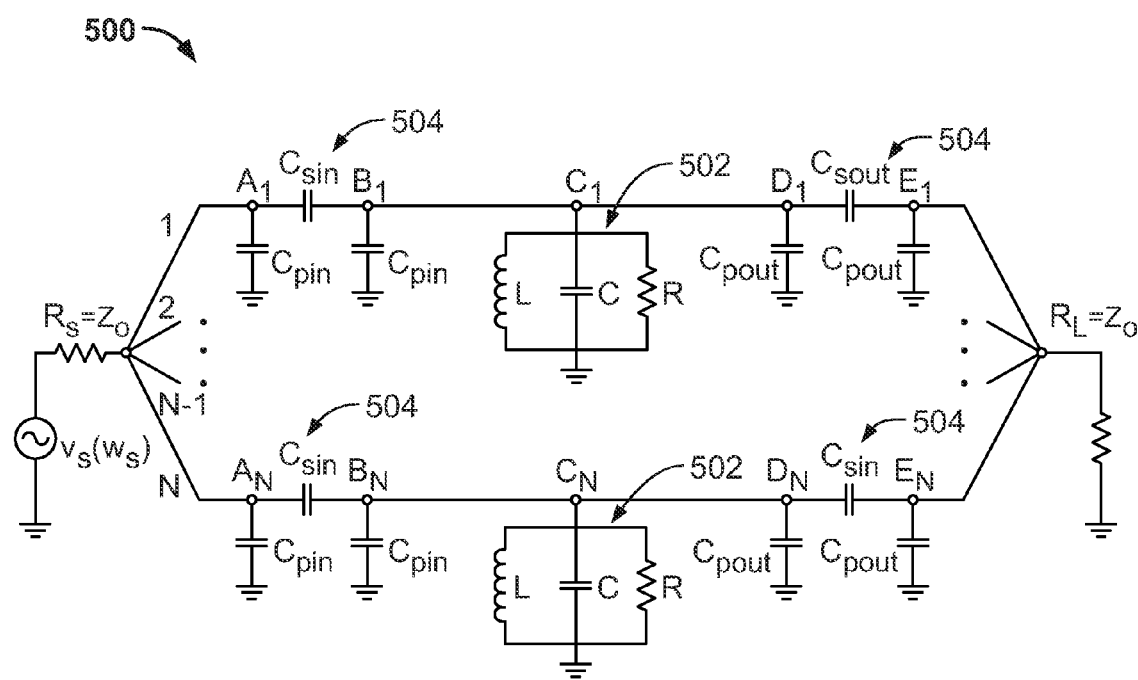
FIG. 5A is a circuit diagram of an example equivalent circuit model for an array of N identical resonators.
Figure 5B:
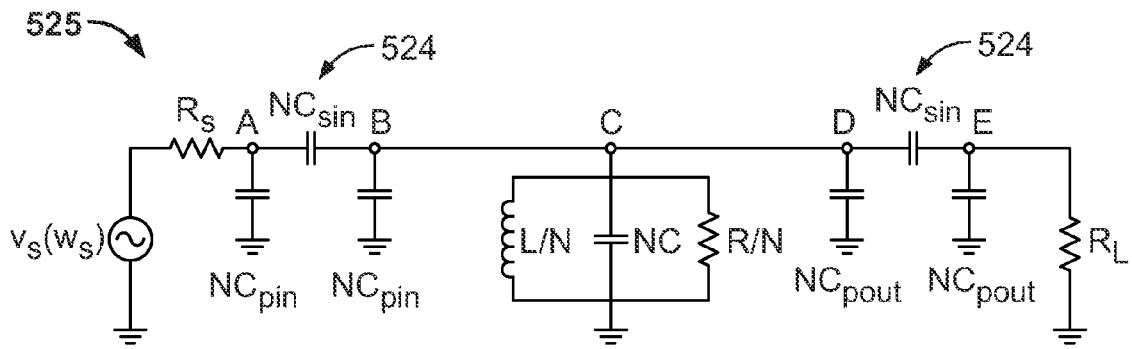
FIG. 5B is a circuit diagram of an example simplified version of the equivalent circuit model shown in FIG. 5A.
Figure 5C:
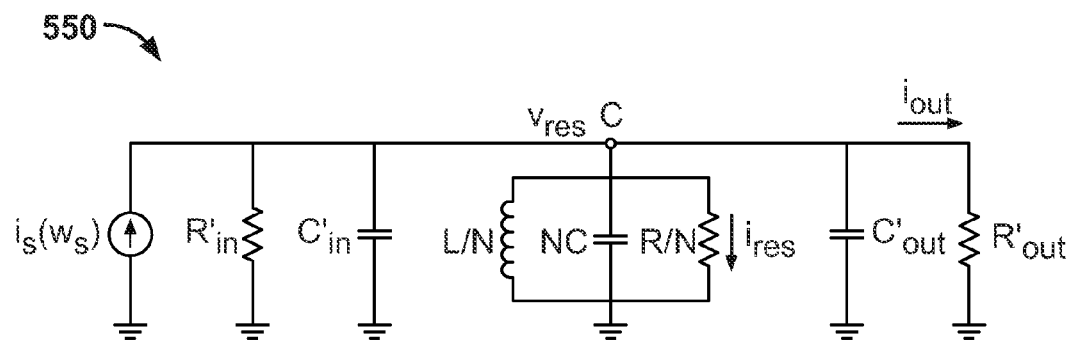
FIG. 5C is a circuit diagram of an example Norton representation of the feeding sections.

In some instances, a full-wave simulation of all aspects of a device (for example, radiation, coupling, package and connector's effects, etc.) can be performed. In some instances, new insights into the device functionality can be obtained by exploring an equivalent circuit model for the resonator device. As an example, for a resonator device that includes an array of N identical resonators, the resonators may terminate with a high impedance (nearly open) for the high quality factor case when the size of the gap is large. FIGS. 5A, 5B, and 5C show some example equivalent circuit models for an example resonator device.

FIG. 5A is a circuit diagram showing an example equivalent circuit model 500 of a resonator device with an array of N identical resonators. For example, the circuit model 500 can be used to model some aspects of the example resonator devices 200, 230, and 260 shown in FIGS. 2A, 2B, and 2C. In the example shown in FIG. 5A, half-wave resonators are modeled by an equivalent parallel RLC circuit 502, and the gaps between the feed lines and resonators are modeled by a π-capacitor circuit 504. The lumped circuit parameters R, L, and C can be found, for example, in terms of the transmission line characteristics impedance $Z_0$, phase constant β, and attenuation constant α associated with the resonators.

FIG. 5B is a circuit diagram 525 showing an example of a simplified version of the circuit model 500 of FIG. 5A. In the case that all feed lines and the gap size are identical for all resonators, all sets of A, B, C, D and E nodes in FIG. 5A can have the same potentials. Therefore, they can be connected to each other and, as a result, the circuit can be reduced to a single effective resonator, as shown in FIG. 5B. According to this simplified circuit diagram 525, the effective coupling π-capacitor in the π-capacitor circuit 524 has been increased by a factor of N compared to the π-capacitor in the π-capacitor circuit 504. Therefore, for a coupled set of N resonators, critical coupling can be achieved with a coupling capacitor N times smaller than the one in the single resonator case. In addition, the internal quality factor $Q_{int} = \omega_r RC$ of the equivalent resonator can remain substantially unchanged compared to the single resonator.

FIG. 5C is a circuit diagram 550 showing an example Norton representation of the feeding sections (e.g., the power division sections at the terminal). In FIG. 5C, the series connection between the source impedance $R_S$ (or $R_L$ in the output) and π-capacitor network is transformed into a Norton equivalent parallel connection of $R_{in}^*$ and $C_{in}^*$ (or $R_{out}^*$ and $C_{out}^*$). The $R_{in}^*$ and $C_{in}^*$ (or $R_{out}^*$ and $C_{out}^*$) can be calculated according to $$R_{in}^* = \frac{1 + N^2 \omega_r^2 (C_{pin} + C_{sin})^2 R_S^2}{N^2 \omega_r^2 C_{sin}^2 R_S} \quad (1)$$

$$C_{in}^* = NC_{pin} + \frac{NC_{sin}[1 + N^2 \omega_r^2 C_{pin}(C_{pin} + C_{sin})R_S^2]}{1 + N^2 \omega_r^2 (C_{pin} + C_{sin})^2 R_S^2} \quad (2)$$

$$R_{out}^* = \frac{1 + N^2 \omega_r^2 (C_{pout} + C_{sout})^2 R_L^2}{N^2 \omega_r^2 C_{sout}^2 R_L} \quad (3)$$

$$C_{out}^* = NC_{pout} + \frac{NC_{sout}[1 + N^2 \omega_r^2 C_{pout}(C_{pout} + C_{sout})R_L^2]}{1 + N^2 \omega_r^2 (C_{pout} + C_{sout})^2 R_L^2} \quad (4)$$

where $\omega_r$ is the first resonance frequency of the resonators. In the case where 50Ω microstrip lines are used at the terminals of the resonator device, $R_S = R_L = Z_0 = 50\Omega$.

Figure 5D:
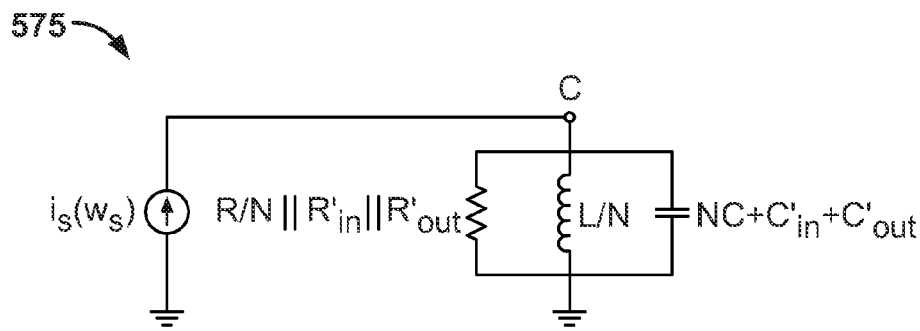
FIG. 5D is a circuit diagram of an example effective resonator.

FIG. 5D is a circuit diagram 575 showing an example effective resonator after incorporating all coupling sections. By considering the effect of both input and output sections into the effective resonator, the effective parallel RLC resonator shown in FIG. 5D can have the following parameters $$Q_{int} = \frac{R}{\omega_r^* L} \quad (5)$$

$$Q_{ext} = \frac{N(R_{in}^* \| R_{out}^*)}{\omega_r^* L} \quad (6)$$

-continued $$\omega_r^* = \frac{1}{\sqrt{LC + \frac{L(C_{in}^* + C_{out}^*)}{N}}} \quad (7)$$

where $Q_{int}$, $Q_{ext}$ and $\omega_r^*$ can represent the internal quality factor, external quality factor, and the shifted resonant frequency respectively. The equivalent circuit models for the resonator device for example, as shown in FIGS. 5A, 5B, 5C, and 5D can provide a framework for designing, analyzing, modifying, refining, or otherwise implementing the resonator device.

Figure 6:
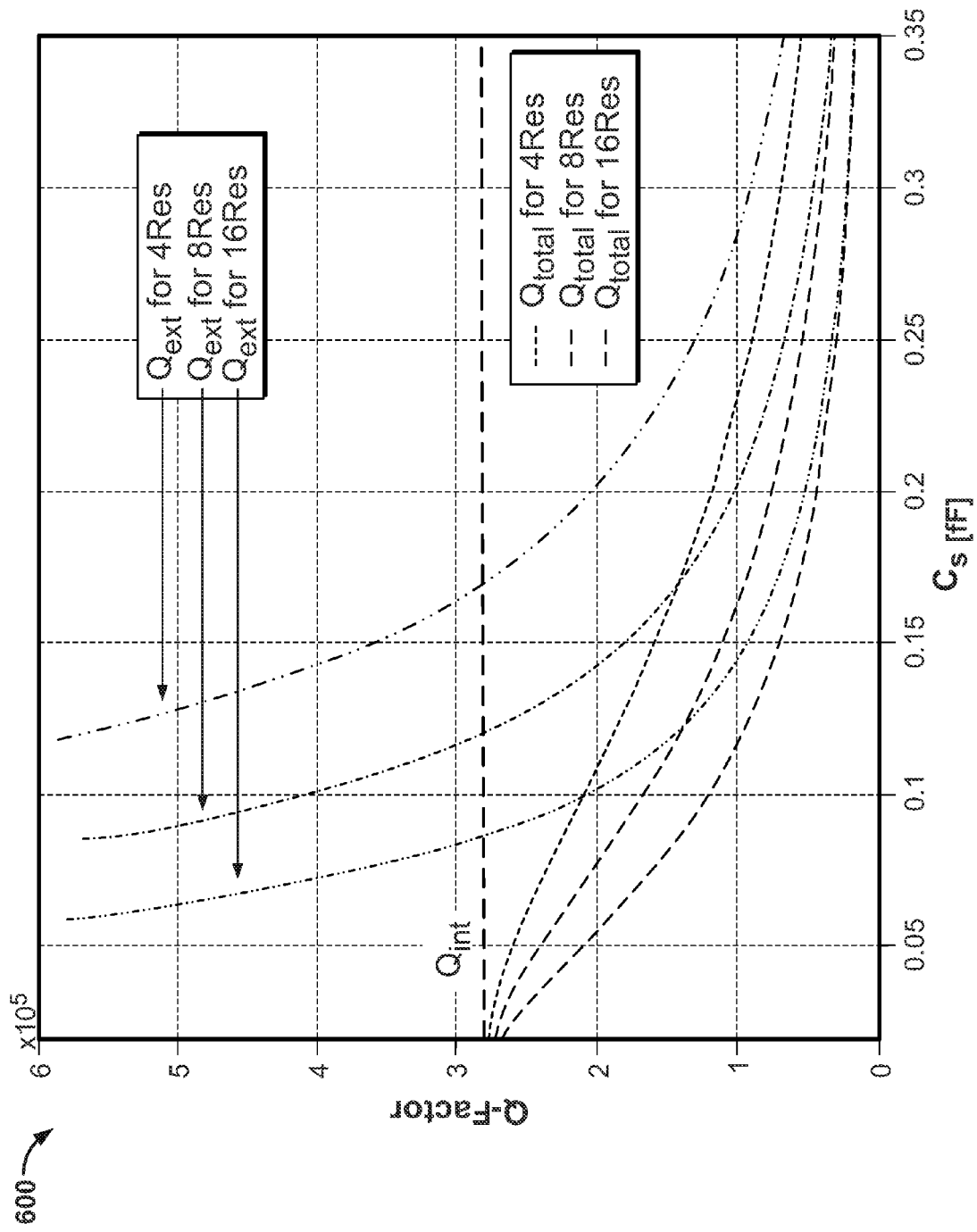
FIG. 6 is a plot showing example quality factors for different numbers of resonators.

FIG. 6 is a plot 600 showing example quality factors for example resonator devices with different number of resonators. The example resonator devices include four, eight, and sixteen resonators and can include features of the example resonator devices shown in FIGS. 1, 2A, 2B, and 2C. For example, the exampled devices can use $\lambda/2$-resonators with length $L_0=5650$ μm and width $W_0=15$ μm for all resonators, and have terminals with width $W_1=355$ μm. The example devices can have microstrip configuration using a 430 μm thick sapphire crystal as the substrate with attenuation constant $\alpha=10^{-4}$ m$^{-1}$ and dielectric constant $\in_r=9.34$. Other components can be calculated, for example, based on $R=Z_0/(\alpha L_0)$, $C=\pi/(2\omega_r Z_0)$, and $L=1/(C\omega_r^2)$.

For symmetric input and output lines with the same coupling (for example, $R_S=R_L$, $C_{pin}=C_{pout}$, and $C_{sin}=C_{sout}$), the quality factors (e.g., internal, external and total quality factors) for different number of resonators are depicted versus the size of the gap (e.g., size G of the gap 250 in FIG. 2B or the gap 290 in FIG. 2C) between the resonators and the feed lines. In the illustrated example of FIG. 6, the quality factors increase as the size of the gap increases. The size of the gap can be configured to provide appropriate capacitive coupling between the feed lines and the respective resonators, for example, based on the spacing between resonators, and other appropriate factors. In some instances, critical coupling can be reached when $Q_{int}=Q_{ext}$. The signal-to-noise ratio in ESR can depend on, among other things, the quality factor Q and the mode volume. In some implementations, by increasing the quality factor Q and matching the mode volume to the sample volume, the system performance can be improved.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of embodiments have been described. Nevertheless, it will be understood that various modifications can be made. Accordingly, other embodiments are within the scope of the following claims.

The invention claimed is:

1. An electron spin resonance (ESR) resonator device comprising:
   a planar substrate having a substrate surface, and having a ground plane surface opposite the substrate surface;
   a ground plane disposed on the ground plane surface;
   a first terminal that includes first terminal segments disposed on the substrate surface, the first terminal including a first terminal conductor disposed on the substrate surface, the first terminal conductor having a first terminal input side and a first terminal segmented side opposite the first terminal input side, the first terminal segmented side including the first terminal segments, the first terminal including a first branching structure between the first terminal input side and the first terminal segmented side;
   a second terminal that includes second terminal segments disposed on the substrate surface opposite the first terminal segments, the second terminal including a second terminal conductor disposed on the substrate surface, the second terminal conductor having a second terminal input side and a second terminal segmented side opposite the second terminal input side, the second terminal segmented side including the second terminal segments, the second terminal including a second branching structure between the second terminal input side and the second terminal segmented side; and
   resonators between the first and second terminals, the resonators including conductors disposed on the substrate surface, each conductor disposed between one of the first terminal segments and a respective, opposite one of the second terminal segments.

2. The ESR resonator device of claim 1, wherein the resonators are microstrip resonators each configured to resonate at the same microwave resonance frequency.

3. The ESR resonator device of claim 1, wherein each of the conductors is elongate and includes:
   a first end capacitively coupled to one of the first terminal segments; and
   a second, opposite end capacitively coupled to one of the second terminal segments.

4. The ESR resonator device of claim 3, comprising:
   a first dielectric volume between the first end of each conductor and one of the first terminal segments; and
   a second dielectric volume between the second end of each conductor and one of the second terminal segments.

5. The ESR resonator device of claim 4, wherein the first and second dielectric volumes each include at least one of dielectric material or vacuum.

6. The ESR resonator device of claim 1, wherein the conductors are parallel to each other, with equal spacing between each neighboring pair of conductors.

7. The ESR resonator device of claim 1, wherein each of the resonators is a half-wave resonator, a full-wave resonator, or a multi-half-wave resonator.

8. The ESR resonator device of claim 1, wherein each of the resonators is configured to resonate at a resonance frequency, and the length of each resonators is an even number of half-wavelengths for the resonance frequency.

9. The ESR resonator device of claim 1, wherein each of the resonators is configured to resonate at a resonance frequency, and the length of each resonators is an odd number of half-wavelengths for the resonance frequency.

10. The ESR resonator device of claim 1, wherein each of the resonators is configured to provide maximum magnetic field at the center of half-wave segments in the resonator.

11. The ESR resonator device of claim 1, wherein the first and second branching structures each include one or more tapered branch sections.

12. The ESR resonator device of claim 1, wherein the first and second branching structures each include successive levels between the input side and the respective segmented side, and the individual branches in each level have twice the impedance of the individual branches in the preceding level.

13. The ESR resonator device of claim 1, wherein the first and second terminal conductors and the resonator conductors form a surface coil on the substrate.

14. The ESR resonator device of claim 13, comprising a sample region adjacent to the surface coil and opposite the substrate.

15. The ESR resonator device of claim 1, wherein the first and second terminal conductors and the resonator conductors are made of superconducting material.

16. The ESR resonator device of claim 1, wherein the planar substrate includes sapphire.

17. The ESR resonator device of claim 1, wherein the planar substrate includes at least one of silicon or quartz.

18. An electron spin resonance (ESR) method comprising:
receiving an excitation and control signal at first and second terminal inputs of an ESR resonator device, the first terminal input conductively coupled to a first set of terminal output segments, the second terminal input conductively coupled to a second set of terminal output segments, the ESR resonator device including a first terminal conductor disposed on a substrate surface, the first terminal conductor comprising the first terminal input, the first set of terminal output segments, and a first branching structure between the first terminal input and the first set of terminal output segments, the ESR resonator device including a second terminal conductor disposed on the substrate surface, the second terminal conductor comprising the second terminal input, the second set of terminal output segments, and a second branching structure between the second terminal input and the second set of terminal output segments;
providing the excitation and control signal from the first and second sets of terminal output segments to a plurality of resonators, the excitation and control signal being delivered in-phase from each of the terminal segments to a respective one of the plurality of resonators; and
producing a magnetic field in a sample region external to the resonators by conducting the excitation and control signal in-phase on the plurality of resonators.

19. The ESR method of claim 18, comprising the plurality of resonators collectively generating a magnetic field that is uniform across a thin sample region.

20. The ESR method of claim 18, comprising providing the excitation and control signal to the resonators by capacitive coupling between:
the first set of terminal output segments and first ends of the resonators; and
the second set of terminal output segments and second, opposite ends of the resonators.

21. The ESR method of claim 20, comprising producing a microwave frequency magnetic field in the sample region by conducting a microwave frequency signal in-phase on the plurality of resonators.

22. An electron spin resonance (ESR) method comprising:
receiving an excitation and control signal at a planar surface coil disposed on a surface of a substrate, the planar surface coil comprising a first terminal conductor, a second terminal conductor and a plurality of parallel conductors disposed on the surface, the first terminal conductor having a first terminal input side and a first terminal segmented side opposite the first terminal input side, the first terminal conductor including first terminal segments and a first branching structure between the first terminal input side and the first terminal segmented side, the second terminal conductor having a second terminal input side and a second terminal segmented side opposite the second terminal input side, the second terminal conductor including second terminal segments and a second branching structure between the second terminal input side and the second terminal segmented side, each of the parallel conductors disposed between one of the first terminal segments and a respective, opposite one of the second terminal segments; and
generating a magnetic field in a sample region adjacent to the surface coil and opposite the substrate, the magnetic field generated by the plurality of parallel conductors each concurrently conducting the excitation and control signal in the same direction and in parallel.

23. The ESR method of claim 22, wherein the excitation and control signal is received at the first terminal segments at a first end of each conductor and at the second terminal segments at a second, opposite end of each conductor.

24. The ESR method of claim 23, wherein the parallel conductors are capacitively coupled to the terminal segments.

25. The ESR method of claim 22, comprising manipulating an electron spin in the sample region by the magnetic field.

26. The ESR method of claim 22, wherein the sample region is a planar volume and the magnetic field is uniform across the planar volume.

* * * * *